United States Patent
Nandanwar et al.

(10) Patent No.: US 12,438,532 B2
(45) Date of Patent: Oct. 7, 2025

(54) POWER SAVING CIRCUITS TO ADJUST FREQUENCY ACCORDING TO DYNAMIC TIMING MARGIN CHANGES AND ADJUST SUPPLY VOLTAGE TO RESTORE DESIRED FREQUENCY AND RELATED METHODS

(71) Applicant: QUALCOMM Incorporated, San Diego, CA (US)

(72) Inventors: Darshan Kumar Nandanwar, Bangalore (IN); Siddesh Halavarthi Math Revana, Bangalore (IN); Kuldeep Singh Chahal, Noida (IN); Srinivasa Kumar Munivenkata Gowda, Bangalore (IN); Nilesh Dhavlikar, Bangalore (IN)

(73) Assignee: QUALCOMM Incorporated, San Diego, CA (US)

( * ) Notice: Subject to any disclaimer, the term of this patent is extended or adjusted under 35 U.S.C. 154(b) by 17 days.

(21) Appl. No.: 18/594,916

(22) Filed: Mar. 4, 2024

(65) Prior Publication Data

US 2025/0279772 A1    Sep. 4, 2025

(51) Int. Cl.
   *H03K 5/135*  (2006.01)
   *G06F 1/10*  (2006.01)

(52) U.S. Cl.
   CPC ............... *H03K 5/135* (2013.01); *G06F 1/10* (2013.01)

(58) Field of Classification Search
   CPC ..................................... H03K 5/135
   USPC ........................................ 327/161
   See application file for complete search history.

(56) References Cited

U.S. PATENT DOCUMENTS

| 2024/0250673 A1* | 7/2024 | Van Ierssel | ............. H03K 5/14 |
| 2024/0372554 A1* | 11/2024 | Fayneh | .................. H03L 7/093 |

OTHER PUBLICATIONS

Bowman, K.A. et al., "A 16 nm All-Digital Auto-Calibrating Adaptive Clock Distribution for Supply Voltage Droop Tolerance Across a Wide Operating Range," IEEE Journal of Solid State Circuits, vol. 51, No. 1, Jan. 2016, IEEE, pp. 8-17.

* cited by examiner

Primary Examiner — Tomi Skibinski
(74) Attorney, Agent, or Firm — W&T (57) ABSTRACT

Small timing margins between the period of a clock and the propagation delays of critical signal paths in an IC at a given supply voltage create a risk for errors in response to voltage droop. Increasing the supply voltage increases the timing margin but also increases power consumption. A margin management circuit includes a delay path having a configurable delay that corresponds to the propagation delay of a critical signal path. Based on a detected timing margin of the delay path, a frequency adjustment signal is generated to adjust the clock frequency to adjust the timing margin. In response to a reduction in the timing margin, due to a sudden voltage droop, the clock frequency may be adjusted to avoid errors. In some examples, the frequency of the clock is compared to a desired frequency and the supply voltage is adjusted to restore the desired frequency.

27 Claims, 6 Drawing Sheets

POWER SAVING CIRCUITS TO ADJUST FREQUENCY ACCORDING TO DYNAMIC TIMING MARGIN CHANGES AND ADJUST SUPPLY VOLTAGE TO RESTORE DESIRED FREQUENCY AND RELATED METHODS

BACKGROUND

I. Field of the Disclosure

The technology of the disclosure relates generally to power reduction in digital circuits in integrated circuits and, more particularly, to providing resilience to timing changes while reducing power consumption.

II. Background

Integrated circuits (ICs) include analog circuits and digital circuits. Combinational logic circuits and sequential logic circuits are different types of digital circuits that may be implemented as transistor circuits. When the "state" (e.g., voltage) of a signal on an input node of a combinational logic circuit changes, that change immediately begins to propagate through the transistor circuits, which may lead to a change in the states of one or more of the output node(s). The state of a signal on an output node of a sequential logic circuit may remain unaffected by the state of a data on an input node until there is a state transition (e.g., from low to high voltage or high to low voltage) of a clock signal on a clock input of the sequential logic circuit. In this regard, sequential circuits may be employed to temporarily hold the state of an output node stable between clock transitions. The signal on the output node may propagate through multiple combinational logic circuits before arriving at an input node of a second sequential logic circuit, where it may change an output node of the second sequential logic circuit at the next (second) transition of the clock signal state (assuming both sequential logic circuits are in a same clock domain, in which all the sequential logic circuits receive the same clock signal). Therefore, the signal must propagate along a path from the output node of the first sequential circuit and through the combinational logic circuits to the input node of the second sequential circuit in less than one period of the clock cycle. Otherwise, the output node of the second sequential logic circuit will not be updated based on such data until the next (third) transition of the clock signal state, which may result in a processing error. In this manner, the propagation delays of signals along paths in digital circuits can limit the frequency (e.g., maximum frequency) of the clock signal provided to the sequential logic circuits. In other words, the clock frequency must stay low enough that a period of the clock signal is greater than or equal to the signal path propagation delay.

However, during sudden surges in activity in an IC, a higher-than-normal amount of current is consumed, which causes voltage levels provided to the transistor circuits to droop slightly before the voltage source can recover. A problem with such droops in voltage is that when a lower supply voltage is provided to the transistor circuits in digital circuits, the propagation time increases. Therefore, when a voltage droop occurs while the clock frequency remains the same, some data signals may not be able to propagate along their entire path before the next clock transition, causing data processing errors. Accordingly, clock frequencies are often reduced to provide a "margin" of safety to protect the digital circuits from a voltage droop situation. Stated differently, the period of a clock signal is made longer than the propagation delay of the longest signal paths to provide a timing margin. The "margin" may also be created by increasing a supply voltage to reduce propagation times, allowing the signals on the longest propagation delays in an IC to reach their destinations with a timing margin before the next clock signal transition. Most of the time, there is no voltage droop, and a timing margin causes the digital circuit to receive at a higher supply voltage than is needed, which causes a greater consumption of power than is necessary for operation at a desired frequency. Many circuits, systems, and methods have been developed to avoid such excess consumption of power while still being capable of responding to the occasional voltage droop.

SUMMARY

Aspects disclosed in the detailed description include power saving circuits to adjust frequency according to dynamic timing margin changes and adjust supply voltage to restore desired frequency. Related methods of saving power including adjusting frequency and voltage according to timing margin changes are also disclosed. A processing circuit in a processor in a clock domain of an integrated circuit (IC) has critical signal paths, which are the signal paths having the longest propagation delays traversed within a single clock period. Small timing margins between the period of a clock and the propagation delays of critical signal paths in an IC at a given supply voltage create a risk for errors in the event of a voltage droop. In this manner, critical signal paths limit the clock frequency. Increasing the supply voltage may increase the timing margin but may also increase excess power consumption. In an exemplary IC, a margin management circuit in the processing circuit includes a configurable logic circuit in which a delay path has a configurable delay that corresponds to the propagation delay of a critical signal path of the processing circuit. An edge detector circuit of the margin management circuit detects a timing margin of the delay path, and a frequency adjustment circuit generates a frequency adjustment signal to adjust, as needed, a frequency of the clock signal based on the timing margin. Reducing the timing margin may reduce power consumption. In addition, in some examples, the margin management circuit may detect a reduction in the timing margin due to a sudden voltage droop and cause the frequency to be reduced (i.e., period to be increased) to avoid errors. In some examples, the frequency adjustment signal is provided to a clock generation circuit, such as a digital phase-locked-loop (DPLL). In some examples, the frequency of the clock signal is compared to a desired frequency of the IC and the supply voltage provided to the clock domain is adjusted to restore the desired frequency of the clock signal.

In this regard, in one exemplary aspect, an integrated circuit (IC) including a first clock domain is provided. The first clock domain includes a first processing circuit including a first critical signal path having a first propagation delay based on a supply voltage provided to the first clock domain, wherein the first critical signal path is one of a plurality of critical signal paths that limit a frequency of a clock signal provided to the first clock domain. The first processing circuit also includes a margin management circuit, which includes a configurable logic circuit including a first delay path having a first configurable delay corresponding to the first propagation delay, an edge detector circuit configured to detect a first timing margin of the first delay path, the timing margin based on a time difference between the first configurable delay and a period of the clock signal, and a frequency adjustment circuit configured to generate a first frequency adjustment signal to adjust a frequency of the clock signal based on the first timing margin.

In another exemplary aspect, a method in an integrated circuit (IC) is provided. The method includes configuring a first delay path of a configurable logic circuit to have a first configurable delay corresponding to a first propagation delay of a first critical signal path of a plurality of critical signal paths in a first processing circuit in a first clock domain, wherein the first propagation delay is based on a supply voltage provided to the first clock domain and each of the plurality of critical signal paths limit a frequency of a clock signal provided to the first clock domain. The method further includes detecting a first timing margin of the first delay path, the first timing margin based on a time difference between the first configurable delay and a period of the clock signal and generating a first frequency adjustment signal to control a frequency of the clock signal based on the first timing margin.

In another exemplary aspect, a package including an integrated circuit (IC) is provided. The package includes a first clock domain, including a plurality of processors configured to operate at a frequency of a clock signal. Each of the plurality of processors includes a first processing circuit including a first critical signal path having a first propagation delay based on a supply voltage provided to the first clock domain, wherein the first critical signal path is one of a plurality of critical signal paths that limit a maximum frequency of the clock signal, and a margin management circuit including a configurable logic circuit including a first delay path configured to have a first configurable delay corresponding to the first propagation delay; an edge detector circuit configured to detect a first timing margin of the first delay path; and a frequency adjustment circuit configured to generate a first frequency adjustment signal to control a frequency of the clock signal based on the first timing margin. Each of the plurality of processors is configured to generate a plurality of frequency adjustment signals, and the first frequency adjustment signal and a second frequency adjustment signal are among the plurality of frequency adjustment signals generated in a first processor. The package further includes an adjustment signal accumulator configured to identify a highest adjustment signal, including one of the plurality of frequency adjustment signals having a greatest magnitude, and generate a frequency change signal based on the highest adjustment signal. The package further includes a timing margin control circuit configured to receive the frequency change signal and generate a clock frequency control signal based on the frequency change signal received in a plurality of cycles of the clock signal and a clock generation circuit configured to generate the clock signal having the frequency based on the clock frequency control signal. The package further includes a voltage controller configured to receive a first indication of the frequency of the clock signal, receive a second indication of a desired frequency of the clock signal, and generate a voltage control signal to adjust the supply voltage provided to the first clock domain based on a difference between the first indication and the second indication. Finally, the package further includes a voltage regulator configured to provide the supply voltage to the first clock domain based on the voltage control signal.

DETAILED DESCRIPTION

Several exemplary aspects of the present disclosure are described in reference to the drawing figures. The word "exemplary" is used herein to mean "serving as an example, instance, or illustration." Any aspect described herein as "exemplary" is not necessarily to be construed as preferred or advantageous over other aspects.

Aspects disclosed in the detailed description include power saving circuits to adjust frequency according to dynamic timing margin changes and adjust supply voltage to restore desired frequency. Related methods of saving power including adjusting frequency and voltage according to timing margin changes are also disclosed. A processing circuit in a processor in a clock domain of an integrated circuit (IC) has critical signal paths, which are the signal paths having the longest propagation delays traversed within a single clock period. Small timing margins between the period of a clock and the propagation delays of critical signal paths in an IC at a given supply voltage create a risk for errors in the event of a voltage droop. In this manner, critical signal paths limit the clock frequency. Increasing the supply voltage may increase the timing margin but may also increase excess power consumption. In an exemplary IC, a margin management circuit in the processing circuit includes a configurable logic circuit in which a delay path has a configurable delay that corresponds to the propagation delay of a critical signal path of the processing circuit. An edge detector circuit of the margin management circuit detects a timing margin of the delay path, and a frequency adjustment circuit generates a frequency adjustment signal to adjust, as needed, a frequency of the clock signal based on the timing margin. Reducing the timing margin may reduce power consumption. In addition, in some examples, the margin management circuit may detect a reduction in the timing margin due to a sudden voltage droop and cause the frequency to be reduced (i.e., period to be increased) to avoid errors. In some examples, the frequency adjustment signal is provided to a clock generation circuit, such as a digital phase-locked-loop (DPLL). In some examples, the frequency of the clock signal is compared to a desired frequency of the IC and the supply voltage provided to the clock domain is adjusted to restore the desired frequency of the clock signal.

Figure 1:
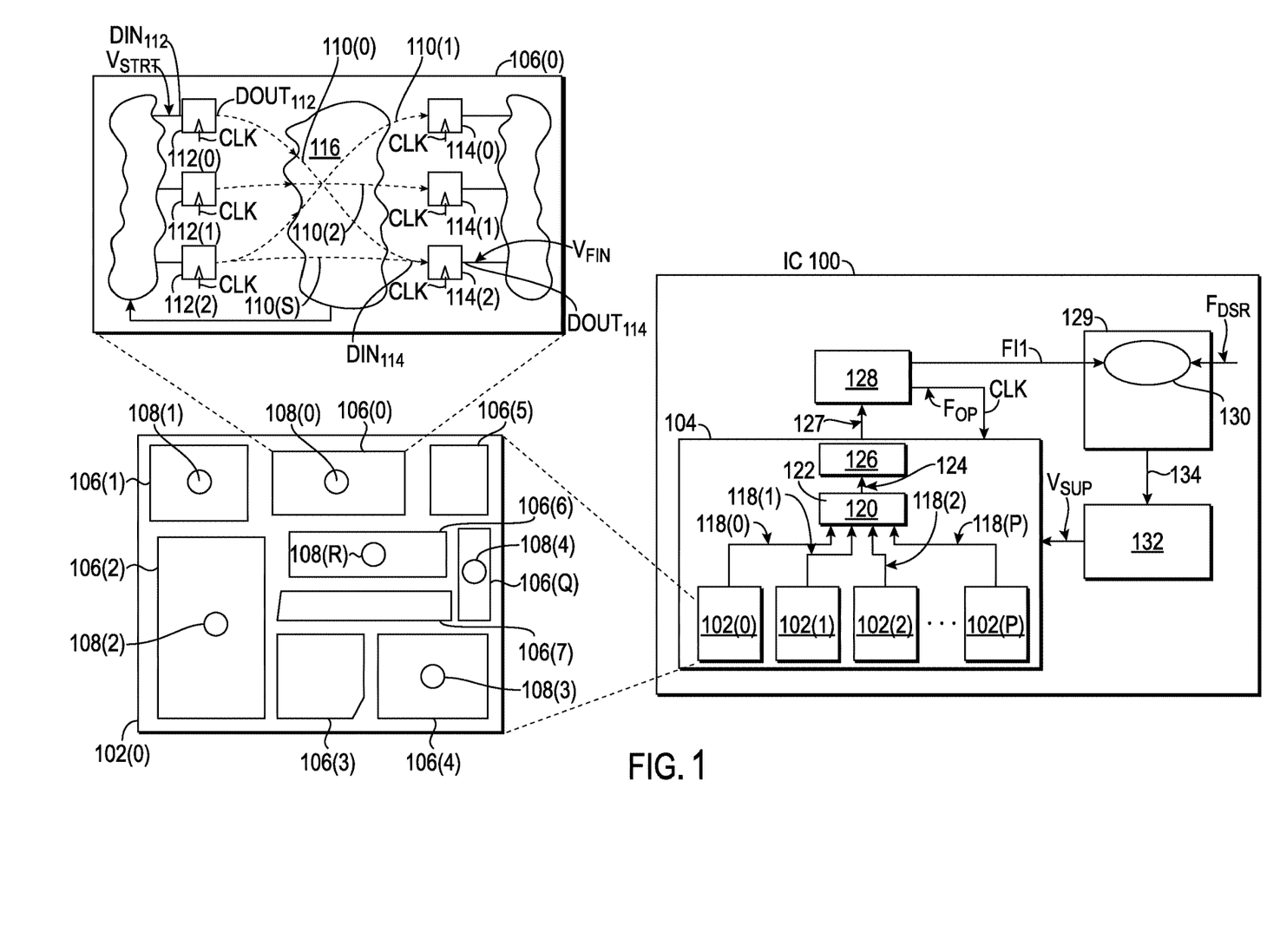
FIG. 1 is a block diagram of an exemplary integrated circuit (IC) in which a clock domain includes a plurality of processor cores that each include processing circuits that may include respective margin management circuits employed to detect timing margins in critical signal paths and generate signals to adjust a frequency of a clock signal and a voltage controller that adjusts a supply voltage to restore the frequency of the clock signal to a desired frequency.

FIG. 1 is a block diagram of an exemplary integrated circuit (IC) 100 which includes a plurality of processor cores 102(0)-102(P) that are in a clock domain 104, and each of the processor cores 102(0)-102(P) include processing circuits, such as processing circuits 106(0)-106(Q) of the processor core 102(0). Any of the processing circuits 106(0)-106(Q) may include one of a plurality of margin management circuits 108(0)-108(R). Each of the processing circuits 106(0)-106(Q) includes digital circuits 109 in which there may be critical signal paths, such as critical signal paths 110(0)-110(S) of the processing circuit 106(0). The margin management circuit 108(0) is employed in the processing circuit 106(0) to detect timing margins in the critical signal paths 110(0)-110(S) and request an adjustment of a frequency of a clock signal CLK of the clock domain 104. In this context, the term "timing margin" may refer to a time difference between a propagation delay and a period $P_{CLK}$ (not shown) of the clock signal CLK. The critical signal paths 110(0)-110(S) have respective propagation delays CPD(0)-CPD(S), based on a supply voltage $V_{SUP}$ provided to the clock domain 104 of the IC 100. In some examples, a frequency adjustment may be requested to avoid errors due to a voltage droop (e.g., when a timing margin becomes too small) or to reduce power consumption (e.g., when a timing margin becomes too big). The margin management circuits 108(1)-108(R) may be employed in any of the processing circuits 106(1)-106(Q) in any of the processor cores 102(0)-102(P) and may function in a manner that corresponds to the margin management circuit 108(0). Some of the processing circuits 106(1)-106(Q) may not have critical signal paths and, therefore, may not include a margin management circuit, as shown in FIG. 1. Inclusion of the margin management circuits 108(0)-108(R) in the processing circuits 106(1)-106(Q) may be a matter of design choice.

In the example of the processing circuit 106(0), the critical signal paths 110(0)-110(S) are circuits through which a signal or signals propagate from a source, such as an output for a first sequential logic circuit 112(0), to a destination, such as a data input of a second sequential logic circuit 114(2), during the period of the clock signal CLK. Any of the sequential logic circuits 112(0)-112(2)-114(0)-114(2) may be memory circuits, registers, flip-flops, latches, etc. In general, a sequential logic circuit is configured to update a voltage state of a data storage node, on which a voltage state may be otherwise maintained, in response to the clock signal CLK and the state of the data received on the data input. In some examples, the storage node may be a data output of the sequential logic circuit. The propagation delays CPD(0)-CPD(S) (not shown) of the critical signal paths 110(0)-110(S) measured from their respective sources to their respective destinations may be the longest propagation delays of all the signals within the processing circuit 106(0). Having small timing margins between the clock period $P_{CLK}$ of the clock signal CLK and the propagation delays CPD(0)-CPD(S) of the critical signal paths 110(0)-110(S) at a given supply voltage $Vsu_p$ create a risk for errors in the event of a voltage droop. Consequently, the critical signal paths 110(0)-110(S) may limit the frequency of the clock signal CLK provided to the clock domain 104. In other words, the clock period $P_{CLK}$ (e.g., a duration of one cycle of the clock signal CLK) must be long enough to allow the signal(s) of all the critical signal paths in the digital circuits 109 to propagate from their source to their destination and be stored or captured successfully. Since the clock period $P_{CLK}$ decreases with an increase in frequency $F_{OP}$ of the clock signal CLK, the critical signal paths 110(0)-110(S) may limit the maximum frequency of the clock signal CLK.

In an example illustrated in FIG. 1, a first rising edge (e.g., rising voltage transition) of the clock signal CLK at the sequential logic circuit 112(0) may allow a starting voltage state $V_{STRT}$ at a data input $DIN_{112}$ of the sequential logic circuit 112(0) to pass through the sequential logic circuit 112(0) to an output $DOUT_{112}$. The voltage state $V_{STRT}$ propagates to the combinational logic circuits 116 where the effect of the voltage state $V_{STRT}$ propagates through the combinational logic circuits 116 and eventually causes a finish voltage state $V_{FIN}$ to be generated on the data input $DIN_{114}$ of the sequential logic circuit 114(2). The finish voltage state $V_{FIN}$ should be stable at the data input $DIN_{114}$ in time to be captured in the sequential logic circuit 114(2) and stored on the output $DOUT_{114}$ in response to the next (second) rising edge of the clock signal CLK. If the period $P_{CLK}$ is too short in duration, the second rising edge of the clock signal CLK may arrive before the finish voltage state $V_{FIN}$ becomes stable on the data input $DIN_{114}$, in which case the finish voltage state $V_{FIN}$ will not be captured (stored) on the output $DOUT_{114}$ of the sequential logic circuit 114(2), causing a loss of data (e.g., processing error).

A negative timing margin indicates that the clock period $P_{CLK}$ is too short for the propagation delay and an error is likely to occur. A positive timing margin indicates that the propagation delay is shorter than the time available within the clock period $P_{CLK}$, which will not cause an error. However, as a positive timing margin is increased, signals may propagate through the critical signal paths with extra time available before the next transition of the clock signal CLK. This extra time is an indication that the clock frequency could be increased for higher performance without causing errors or the supply voltage $V_{SUP}$ provided to the IC 100 could be reduced. It should be understood that the sequential logic circuits 112(0)-112(2) and 114(0)-114(2) are merely exemplary and there may be any positive integer number of sequential logic circuits in each processing circuit. Any of the sequential logic circuits 112(0)-112(2)-114(0)-114(2) may be memory circuits. In addition, the combinational logic circuits 116 are representative of multiple combinational logic circuits coupled between respective sequential logic circuits.

As explained in more detail below, all of the margin management circuits 108(0)-108(R) in the processing circuits 106(0)-106(Q) of the processor cores 102(0)-102(P) may generate frequency adjustment signals 118(0)-118(P) requesting adjustments to the frequency $F_{OP}$ (current operating frequency) of the clock signal CLK in response to determining that one or more timing margins is too large, too small, or negative, for example. There may be an acceptable range of the timing margins in which the margin management circuits 108(0)-108(R) do not request a change in the frequency $F_{OP}$. Such an acceptable range may be based on testing and/or a desire to reduce power consumption while maintaining some protection against sudden voltage droops, as well as other factors.

The IC 100 includes an adjustment signal accumulator 120 to receive the frequency adjustment signals 118(0)-118 (P) and identify a top adjustment signal 122, which is the one of the frequency adjustment signals 118(0)-118(P) that is greatest. In other words, the top adjustment signal 122 may indicate the largest magnitude timing margin or may be requesting a frequency change of the greatest magnitude (or both) when compared to the other frequency adjustment signals 118(0)-118(P). The adjustment signal accumulator 120 generates a frequency control signal 124 based on the top adjustment signal 122 to control the frequency $F_{OP}$ of the clock signal CLK. The frequency control signal 124 may be provided to a clock control circuit 126 that is configured to control the frequency $F_{OP}$ of the clock signal CLK provided to the clock domain 104 based on the frequency control signal 124 received in the clock control circuit 126 in a plurality of (e.g., at least two) cycles of the clock signal CLK. In some examples, the frequency $F_{OP}$ of the clock signal CLK may be adjusted based on an average of the frequency control signal 124 over two or more clock cycles of the clock signal CLK. In other examples, the frequency control signals 124 received in the clock control circuit 126 may be combined or considered using alternative methods to adjust the frequency $F_{OP}$. To control the frequency $F_{OP}$ of the clock signal CLK, the clock control circuit 126 sends a control signal 127 to a clock generation circuit 128, which may be a digital phase-locked-loop (DPLL), for example. The clock generation circuit 128 generates the clock signal CLK at the frequency $F_{OP}$ based on the control signal 127.

The IC 100 also includes a voltage controller 129 in which a comparator 130 is employed to compare the frequency $F_{OP}$ of the clock signal CLK to a desired frequency $F_{DSR}$. The comparator 130 receives a first indication FI1 of the frequency $F_{OP}$ of the clock signal CLK and a second indication FI2 of the desired frequency $F_{DSR}$. The indications may be the clock signal CLK and a desired clock signal having the desired frequency. Alternatively, the indications may be binary values, voltage levels, or any appropriate means for indicating the respective frequencies. The desired frequency $F_{DSR}$ is a predetermined frequency of operation of the clock domain 104, which may be preferred or needed for one of a variety of reasons, including synchronization with other circuits, power balancing, thermal dissipation rates, etc. Based on a result from the comparator 130, the voltage controller 129 controls a voltage regulator 132 to adjust a supply voltage $V_{SUP}$ that is provided to the IC 100. That is, the voltage controller 129 generates a voltage control signal 134 to adjust the supply voltage $V_{SUP}$ provided to the first clock domain 104 based on a difference between the first indication FI1 and the second indication FI2. For example, in response to the frequency $F_{OP}$ of the clock signal CLK being higher than the desired frequency $F_{DSR}$ by at least a first threshold, the voltage controller 129 is configured to generate the voltage control signal 134 to decrease the supply voltage $V_{SUP}$ provided to the first clock domain 104 and in response to the frequency $F_{OP}$ being lower than the desired frequency $F_{DSR}$ by at least a second threshold, the voltage controller 129 is configured to generate the voltage control signal 134 to increase the supply voltage $V_{SUP}$. On the other hand, in response to a difference between the frequency $F_{OP}$ and the desired frequency $F_{DSR}$ being smaller than the first threshold and the second threshold, the voltage controller 129 is configured to generate the voltage control signal 134 to maintain a same supply voltage $V_{SUP}$ to the clock domain 104. In some examples, the voltage controller 129 updates the voltage control signal 134 no more often than once in a programmable period of time that may be a multiple of the period $P_{CK}$ of the clock signal CLK and the voltage controller 129 is configured to change the supply voltage $V_{SUP}$ by no more than a programmable or predetermined voltage increment in each of the programmable periods.

It should be recognized that the supply voltage $V_{SUP}$ is a feedback based on the determined timing margin. That is, as a timing margin starts to decrease due to factors such as temperature increase or circuit aging, the control signal 127 decreases the frequency $F_{OP}$ of the clock signal CLK generated in the clock generation circuit 128. In turn, a difference between the frequency $F_{OP}$ and the desired frequency $F_{DSR}$ is recognized by the comparator 130, causing the voltage control signal 134 to increase the voltage to increase the timing margin. In this manner, the timing margin corresponds to a voltage margin in the supply voltage $V_{SUP}$. The translation from a change in timing margin to a change in voltage margin may be provided by employing programmable registers/latches/fuses (not shown) in the voltage controller 129 set with the translation values. As an example, a one percent (1%) change to the timing margin at a given voltage/frequency point may translate to a corresponding number of millivolt adjustment in the supply voltage $V_{SUP}$. The translation values may be set based on testing and with consideration for anticipated changes to circuit parameters over time.

The supply voltage $V_{SUP}$ is adjusted to restore or return the frequency $F_{OP}$ of the clock signal CLK back to the desired frequency $F_{DSR}$ when the comparator 130 determines that the frequency $F_{OP}$ is not at the desired frequency $F_{DSR}$. That is, a higher supply voltage $V_{SUP}$ tends to increase propagation rates of signals through the combinational logic circuit 116, for example, which reduces propagation delays CPD(0)-CPD(S). Thus, higher supply voltage $V_{SUP}$ may allow the frequency $F_{OP}$ to be increased after it has been lowered in response to a voltage droop, for example. Conversely, if the frequency $F_{OP}$ is determined to be higher than the desired frequency $F_{DSR}$, a lower supply voltage $V_{SUP}$ slows propagation, increasing propagation delays CPD(0)-CPD(S) in the critical signal paths 110(0)-110(S) and reducing timing margins, which may cause the margin management circuits 108(0)-108(R) to reduce the frequency $F_{OP}$ of the clock signal CLK.

In an exemplary aspect, the margin management circuits 108(0)-108(R) may be able to respond to a sudden decrease in timing margin due to a voltage droop in the supply voltage $V_{SUP}$, which may include quickly reducing the frequency $F_{OP}$ of the clock signal CLK to avoid a processing error. In this example, when the voltage controller 129 sees that the frequency $F_{OP}$ is lower than the desired frequency $F_{DSR}$, the voltage controller 129 may control the voltage regulator 132 to increase the supply voltage $V_{SUP}$. As the supply voltage $V_{SUP}$ increases, the margin management circuits 108(0)-108(R) will detect an increase in the timing margin and request an increase of the frequency $F_{OP}$ of the clock signal CLK signal, which will eventually return the frequency $F_{OP}$ back to the desired frequency $F_{DSR}$.

Figure 2:
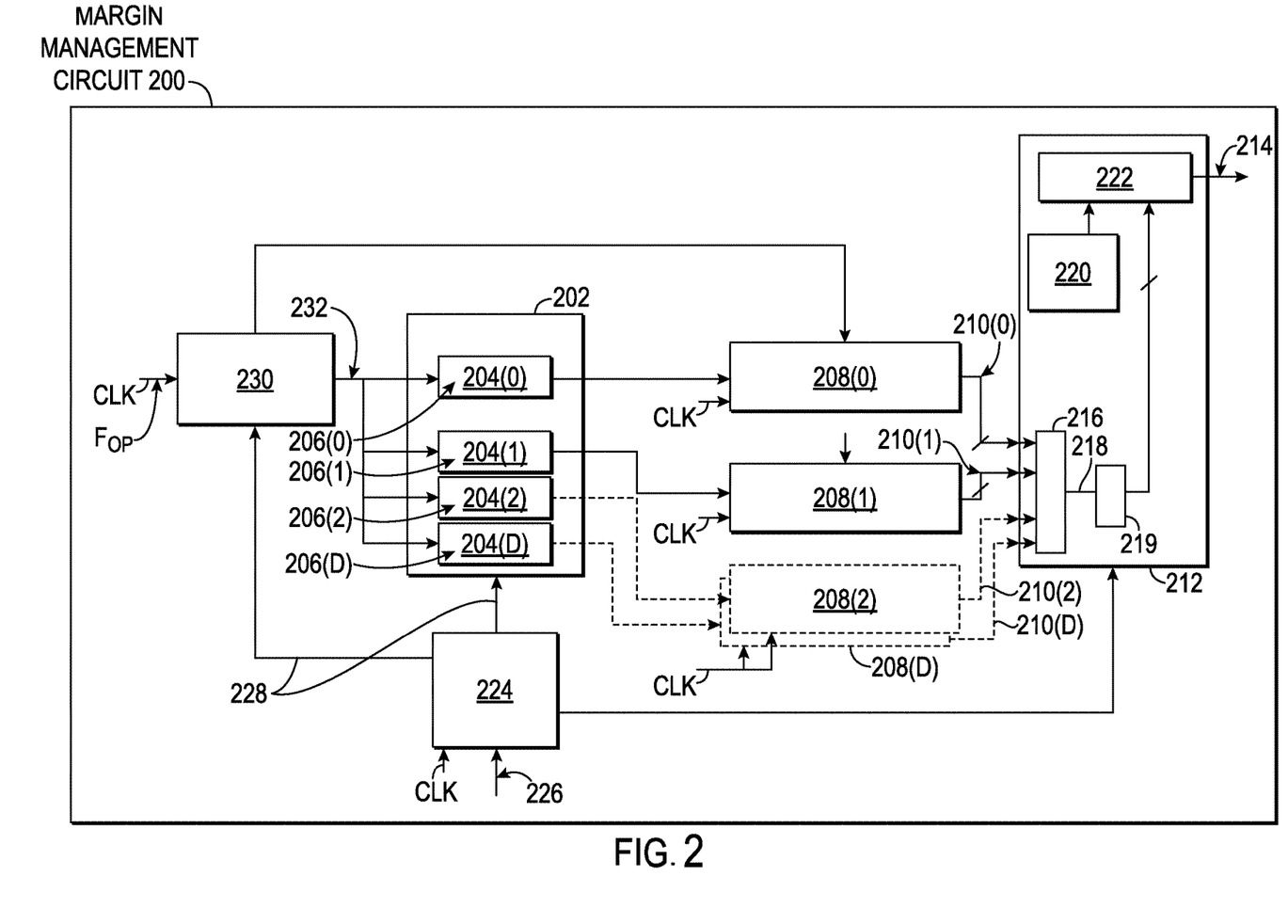
FIG. 2 is a block diagram of a margin management circuit in the IC in FIG. 1, including a configurable logic circuit including a first delay path having a delay configured to correspond to a propagation delay of a critical signal path, an edge detector configured to detect a timing margin of the first delay path, and a frequency adjustment circuit to adjust the frequency of the clock signal based on the timing margin.

FIG. 2 is a block diagram of a margin management circuit 200, which may be one of the margin management circuits 108(0)-108(R) in FIG. 1 and is described with reference to both FIG. 1 and FIG. 2. The purpose of the margin management circuit 200 is to measure, in real-time, a timing margin of a critical signal path in a processing circuit at the frequency $F_{OP}$ of a clock signal CLK. As discussed above, that measurement may be determined by comparing the propagation delay of a critical signal path to the period $P_{CLK}$ of the clock signal CLK. To directly measure the propagation delay of the critical signal paths would require additional circuits that would cause additional loading to the combinational logic circuits in the critical signal path and increase congestion in a circuit area that is already congested. Thus, adding circuits to directly measure the propagation delays may increase the propagation delay of a critical signal path.

One alternative is to create a dummy signal path having the same propagation delay as the critical signal path and determining the timing margin of the dummy signal path in real time. As an example, the propagation delay of a critical signal path may be measured (e.g., in a device tester) under certain circuit parameters, including process, voltage, and temperature (PVT) conditions. Then, a dummy signal path may be implemented by a series of inverters having the same propagation delay. A number of inverters in the series may be selected to have a propagation delay that is as close as possible to the critical signal path. However, as PVT circuit parameters vary, the propagation delay of the dummy signal path comprising only inverters may respond differently under different conditions than the critical signal path itself, which may include a variety of combinational logic circuits. Thus, a series of inverters may not be a reliable dummy signal path for determining timing margin under varying conditions.

In this regard, the margin management circuit 200 includes a configurable logic circuit 202 including delay paths 204(0)-204(D) having configurable delays 206(0)-206(D) that may correspond to propagation delay CPD(0)-CPD(S) of the critical signal paths 110(0)-110(S). The delay paths 204(0)-204(D) are configurable logic circuits that may include various types of combinational logic circuits, such as not-ANDs (NANDs), not-ORs (NORs), adder circuits (for adding binary numbers), pass gates, wires, etc. which can provide dummy signal paths that more accurately correspond to (e.g., mimic) the timing of the critical signal paths not only under normal conditions, but also correspond to the types of combinational logic circuits in the critical signal paths to stay more consistent with the propagation delays of the critical signal paths as they vary with PVT conditions. The delay paths 204(0)-204(D) are located in close proximity but not in the critical signal path, to ensure that the conditions of the delay paths 204(0)-204(D) are the same as or close to the critical signal paths 110(0)-110(S) whose delays they are mimicking.

The margin management circuit 200 also includes edge detector circuits 208(0)-208(D) configured to detect timing margins 210(0)-210(D) of the delay paths 204(0)-204(D) at the frequency $F_{OP}$ of the clock signal CLK, which is the clock signal provided to sequential logic circuits at one or both ends of the critical signal paths. Further details of the edge detector circuits 208(0)-208(D) are provided below. The margin management circuit 200 also includes a frequency adjustment circuit 212 that receives the timing margins 210(0)-210(D) and generates a frequency adjustment signal 214 that may be sent to the adjustment signal accumulator 120 of FIG. 1 to adjust the frequency $F_{OP}$ of the clock signal CLK based on the timing margins 210(0)-210(D). The frequency adjustment signal 214 may be one of the frequency adjustment signals 118(0)-118(P) in FIG. 1. As described below, with reference to the edge detector circuit, the frequency adjustment signal 214 is generated to control the frequency $F_{OP}$ of the clock signal CLK based on a time difference between the configurable delays 206(0)-206(D) of the delay paths 204(0)-204(D) and a period $P_{CK}$ of the clock signal CLK. Factors in choosing the preferred timing margin may include safety against sudden voltage droops and a desire to avoid excess power consumption.

The configurable logic circuit 202 includes multiple delay paths 204(0)-204(D) that are each coupled to a corresponding one of the edge detector circuits 208(0)-208(D) and the edge detector circuits 208(0)-208(D) generate the timing margins 210(0)-210(D) for the respective delay paths 204(0)-204(D). The frequency adjustment circuit 212 includes a margin comparator 216 that determines a top margin 218 based on which of the timing margins 210(0)-210(D) is greatest in magnitude and, therefore, may require the greatest adjustment to the frequency $F_{OP}$. The top margin 218 may be stored in a register 219 in the margin comparator 216, for example. The timing margins 210(0)-210(D) generated by the edge detector circuits 208(0)-208(D) are digital indications of time, where each digital indication may be referred to as a digital value or a digital pattern that corresponds to an incremental or granular time measurement. To adjust the frequency $F_{OP}$ by an appropriate amount in response to each one of the digital patterns in the top margin 218, the frequency adjustment circuit 212 includes a conversion circuit 220 and an adjustment signal generator 222. In the example in FIG. 2, the adjustment signal generator 222 receives the top margin 218 and consults the conversion circuit 220. The conversion circuit 220 provides a conversion for the digital pattern of the top margin 218 to a format of a request for frequency adjustment in the frequency adjustment signal 214. The conversion circuit 220 may be programmable and may be implemented as a lookup table, for example, from which the frequency adjustment signal 214 may be determined based on the top margin 218.

Referring back to the configurable logic circuit 202, the delay paths 204(0)-204(D) may be employed to provide up to "D+1" dummy signal paths, which may each include different types of combinational logic circuits to correspond to one of the critical signal paths. In addition, each of the delay paths 204(0)-204(D) may have different configurable delays 206(0)-206(D). Depending on the PVT conditions, any one of the critical signal paths may develop the worst propagation delay. For this reason, each of the edge detector circuits 208(0)-208(D) may be employed to determine the timing margin for one of the delay paths 204(0)-204(D). Any one of the edge detector circuits 208(0)-208(D) may detect the worst timing margin depending on conditions, and an adjustment to the frequency $F_{OP}$ of the clock signal CLK may be made to address the worst timing margin. As noted above, the margin comparator 216 determines a top margin 218 based on the timing margins 201(0)-210(D) detected by the edge detector circuits 208(0)-208(D). It should be understood that some of the delay paths 204(0)-204(D) may be unused in a given configurable logic circuit 202. It should also be understood that a margin management circuit 200 may be employed in a processing circuit or any other digital circuit in a wired or wireless user device or a network device having critical signal paths as described herein for the purpose of identifying timing margins of the critical signal paths under various PVT conditions and to adjust a frequency of a clock signal therein and is not limited to use in processing circuits in processor cores as described herein.

As shown in FIG. 2, the margin management circuit 200 also includes a configuration circuit 224 that interprets configuration instructions 226 (e.g., programming data), and provides configuration data 228 to configure the configurable logic circuit 202 accordingly. The configuration circuit 224 may also provide the configuration data 228 to a pulse generator 230 that receives the clock signal CLK and controls a pulse signal 232 that is provided to the delay paths 204(0)-204(D). The pulse signal 232 provides pulses (e.g., voltage transitions) that may be synchronized with the transitions of the clock signal CLK. Thus, the pulses of the pulse signal 232 may be separated in time by the period $P_{CLK}$ of the clock signal CLK. The pulse generator 230 may also be used generate a voltage transition (e.g., edge) in the clock signal CLK at an adjusted timing based on variations in the PVT and age conditions of the critical signal paths 110(0)-110(S) and the delay paths 204(0)-204(D).

Figure 3A:
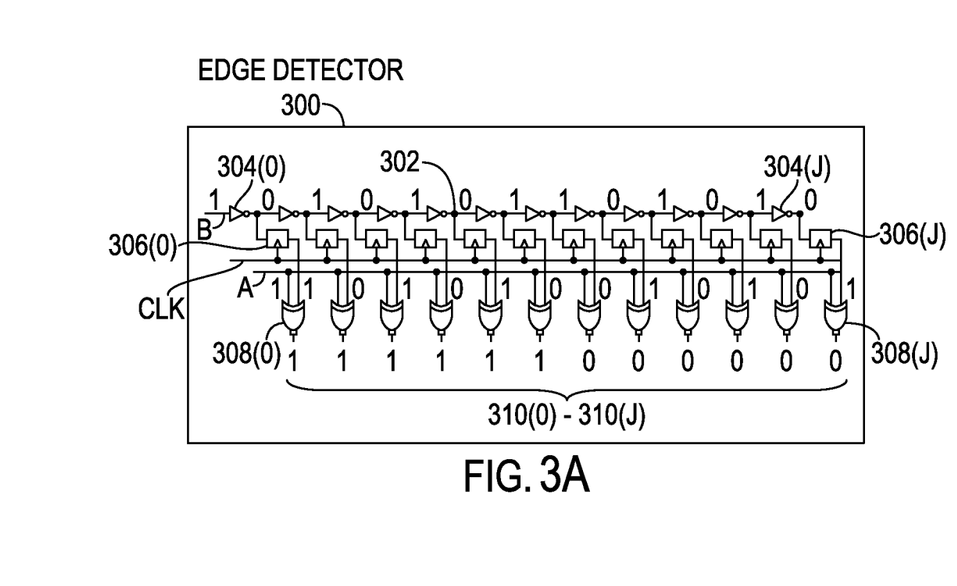
FIG. 3A is a schematic diagram of an example of an edge detector that may be employed in the margin management circuits in FIGS. 1 and 2 for detecting a time margin of a propagation delay of a critical signal path at an operating frequency of a clock signal.

FIG. 3A is a schematic diagram of one example of an edge detector 300 that could be employed as the edge detector circuits 208(0)-208(D) in the margin management circuit 200 in FIG. 2 for detecting a time margin of a propagation delay of a critical signal path 110 as shown in FIG. 1 at the frequency $F_{OP}$ of the clock signal CLK. The edge detector 300 detects a timing of a state transition (e.g., rising edge) of monitored signal "B" relative to the clock signal CLK. A signal output from one of the delay paths 204(0)-204(D), for example 204(0) for this description, is provided as the monitored signal "B" to an inverter chain 302 of inverters 304(0)-304(J). Each of the inverters 304(0)-304(J) is coupled to one of sequential logic circuits 306(0)-306(J) to capture the outputs of the inverters 304(0)-304(J) at a rising edge of the clock signal CLK. The logic circuits 308(0)-308(J) compare a bit pattern captured in the sequential logic circuits 306(0)-306(J) to an expected bit pattern on signal "A," which corresponds to an expected time difference between the rising edge (e.g., positive voltage transition) of the monitored signal B and the rising edge of the clock signal CLK. It should be understood that the time difference may be determined using negative (falling) transitions or a combination of rising and falling transitions of the monitored signal B and the clock signal CLK. Pattern bits 310(0)-310(J) are a result of the comparison and are produced as an output of the edge detector 300 to indicate a timing of the monitored signal B relative to the rising edge of the clock signal CLK. In the edge detector 300 in FIG. 3A, there are twelve (12) inverters 304(J) (i.e., J=11), which define a range of detectable timing margin variation of the monitored signal B, where a change in the detected rising edge by one-bit position in the pattern bits 310(0)-310(J) corresponds to the delay of one of the inverters 304(0)-304(J).

In view of the range of pattern bits 310(0)-310(J), the pattern bit 310(6) may be an indicator of a timing guard band set point, at which the timing margin is at a desirable compromise between safety against voltage droops and minimizing excess power consumption. The clock signals CLK generated in each of the pulse generators 230 may be calibrated to this set point. The clock signals CLK may be calibrated at a nominal voltage with the desired timing margin and frequency while running a representative workload in the processing circuits 106(0)-106(Q). In some examples, a quantization error of the edge detector 300 due to delays of the inverters 304(0)-304(J) may cause the set point to be indicated at one of the pattern bits 310(5-310(8). After calibration, a movement of the rising edge toward the pattern bit 301(0) (e.g., due to a temperature reduction or a voltage increase) would indicate a decrease in timing margin whereas movement of the rising edge toward the pattern bit 310(J) indicates an increase of timing margin.

Figure 3B:
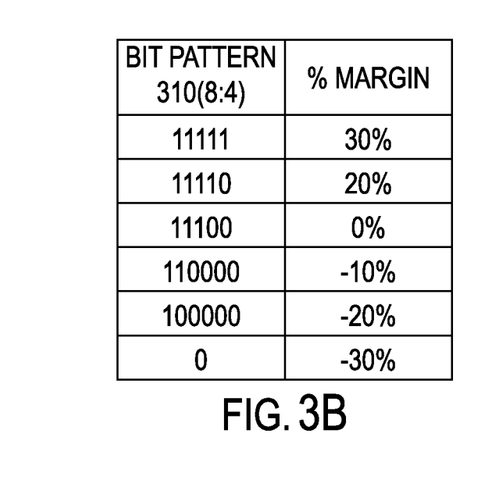
FIG. 3B is a table showing examples of output patterns of the edge detector in FIG. 3A and indications of the margins represented by such output patterns.

FIG. 3B is a table showing a range of bits 310(8)-310(4) of the bit pattern 310(0)-310(J) from the edge detector 300 in FIG. 3A. Based on the number of inverters J=12, the rising edge of monitored signal B is expected to occur in the middle of the bit pattern 310(0)-310(J) (e.g., 310(6)) when the propagation delay through the delay path 204(0), in this example, is at a preferred or optimal timing margin. The preferred timing margin may be selected as a compromise between providing safety against sudden voltage droop and avoiding excess power consumption. As indicated in FIG. 3B, in this example, each change in the bit position of the rising edge, shown as a transition from "0" to "1", indicates a ten percent (10%) change in the timing margin. As the percentage change with each bit position depends on a relationship between the delay of inverters 304(0)-304(J) and the total configurable delay of the delay path 204(0), this is merely one example of the percent change. A shift in the bit position of the first "1" in the bit pattern 310(0)-310(J) in a first direction may indicate a positive timing margin, and a shift in the opposite direction may indicate a negative timing margin. In this manner, the edge detector 300 is configured to indicate the timing margin as one of a plurality of incremental magnitudes have a polarity sign, where the incremental magnitudes and the polarity sign are indicated by the positions at which the bit of the bit pattern 310(0)-310(J) transitions from a "0" to a "1."

Figure 4:
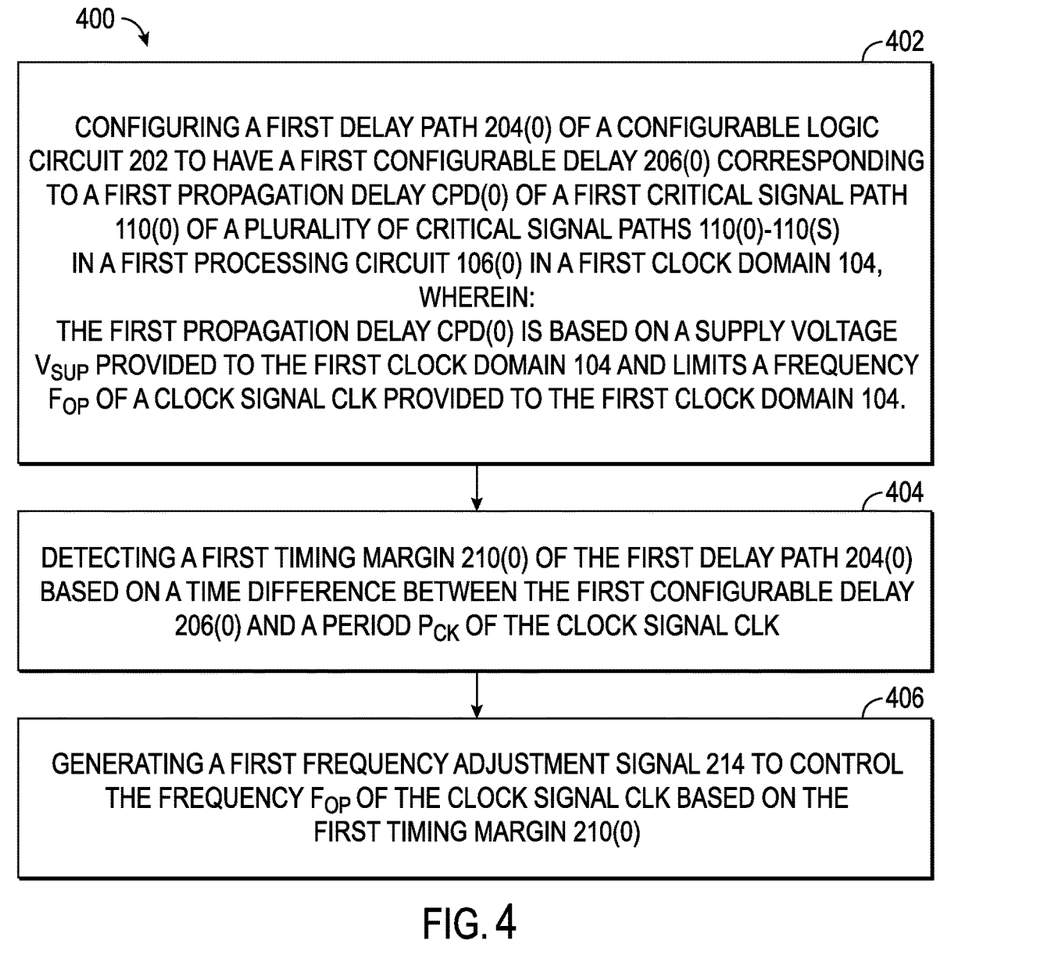
FIG. 4 is a flowchart of an exemplary process in the IC in FIG. 1, in which timing margins of critical signal paths are detected, signals are generated to adjust a frequency of a clock signal, and a supply voltage is adjusted to restore the frequency of the clock signal to a desired frequency.

FIG. 4 is a flowchart of an exemplary method 400 in an IC 100. The method 400 includes configuring a first delay path 204(0) of a configurable logic circuit 202 to have a first configurable delay 206(0) corresponding to a first propagation delay CPD(0) of a first critical signal path 110(0) of a plurality of critical signal paths 110(0)-110(D) in a first processing circuit 106(0) in a first clock domain 104, wherein the first propagation delay CPD(0) is based on a supply voltage $V_{SUP}$ provided to the first clock domain 104, and each of the plurality of critical signal paths 110(0)-110(D) limit a frequency $F_{OP}$ of a clock signal CLK provided to the first clock domain 104 (block 402). The method includes detecting a first timing margin 210(0) of the first delay path 204(0) (block 404). The method also includes generating a first frequency adjustment signal 214 to control a frequency $F_{OP}$ of the clock signal CLK based on the first timing margin (block 406).

Electronic devices, according to any aspects disclosed herein, may be provided in or integrated into any processor-based device. Examples, without limitation, include a set-top box, an entertainment unit, a navigation device, a communications device, a fixed location data unit, a mobile location data unit, a global positioning system (GPS) device, a mobile phone, a cellular phone, a smartphone, a session initiation protocol (SIP) phone, a tablet, a phablet, a server, a computer, a portable computer, a mobile computing device, laptop computer, a wearable computing device (e.g., a smartwatch, a health or fitness tracker, eyewear, etc.), a desktop computer, a personal digital assistant (PDA), a monitor, a computer monitor, a television, a tuner, a radio, a satellite radio, a music player, a digital music player, a portable music player, a digital video player, a video player, a digital video disc (DVD) player, a portable digital video player, an automobile, a vehicle component, an avionics system, a drone, and a multicopter.

Figure 5:
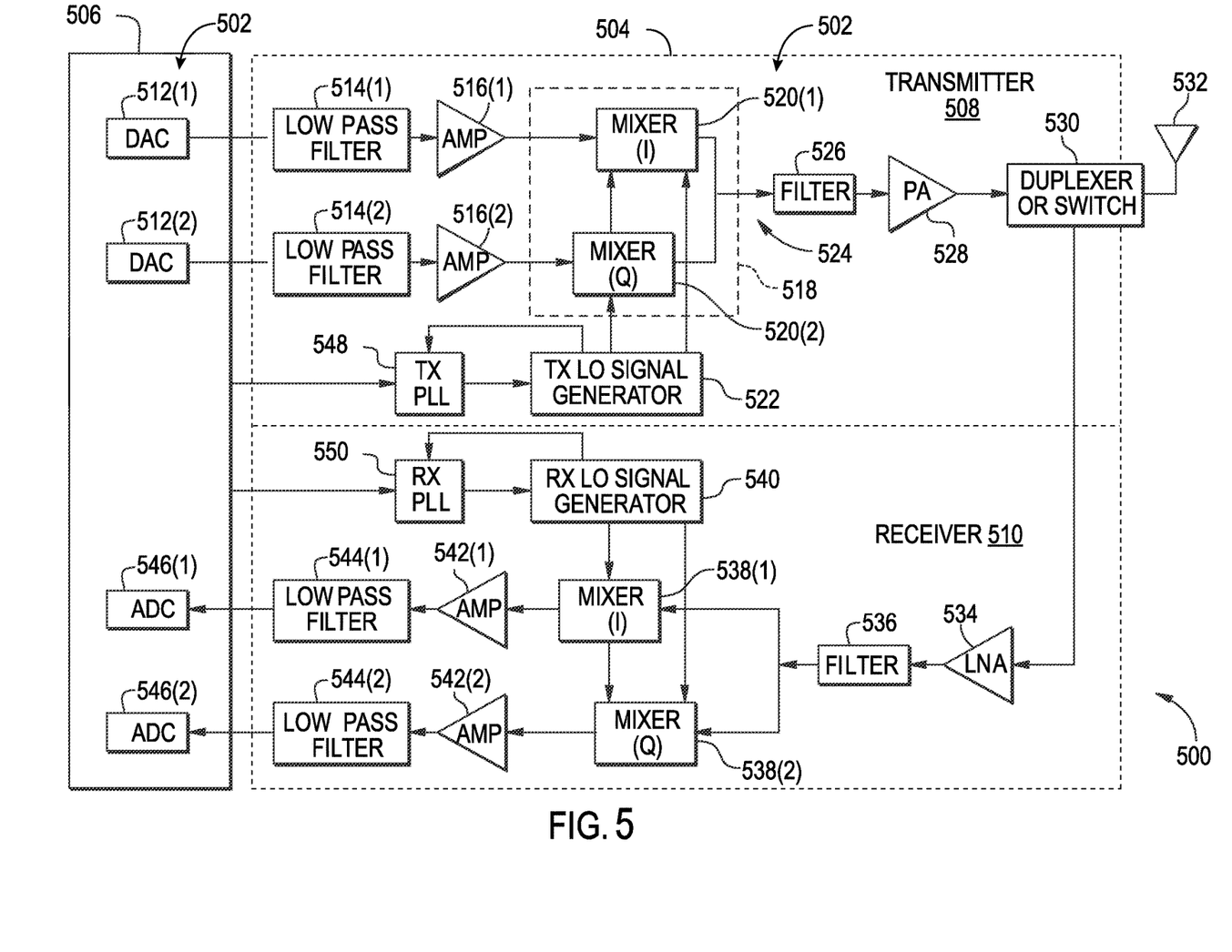
FIG. 5 is a block diagram of an exemplary transistor circuit on an exemplary IC die in which a clock domain includes a plurality of processor cores that each include processing circuits which may include respective margin management circuits as illustrated in FIG. 1 to detect timing margins in critical signal paths and generate signals to adjust a frequency of a clock signal and a voltage controller that adjusts a supply voltage to restore the frequency of the clock signal to a desired frequency as illustrated in the flowchart in FIG. 4.

In this regard, FIG. 5 illustrates a block diagram of an exemplary wireless communications device 500 that includes radio frequency (RF) components formed from one or more ICs 502, wherein the communications device 500 may include the IC 100 in FIG. 1, in which a clock domain includes processing circuits that may include respective margin management circuits as shown in FIG. 2 employed to detect timing margins in critical signal paths and generate signals to adjust a frequency of a clock signal and a voltage controller as shown in FIG. 1 that adjusts a supply voltage to restore the frequency of the clock signal to a desired frequency. The wireless communications device 500 may include or be provided as examples in any of the above-referenced devices. As shown in FIG. 5, the wireless communications device 500 includes a transceiver 504 and a data processor 506. The data processor 506 may include a memory to store data and program codes. The transceiver 504 includes a transmitter 508 and a receiver 510, which support bi-directional communications. In general, the wireless communications device 500 may include any number of transmitters 508 and/or receivers 510 for any number of communication systems and frequency bands. All or a portion of the transceiver 504 may be implemented on one or more analog ICs, RF ICs (RFICs), mixed-signal ICs, etc.

The transmitter 508 or the receiver 510 may be implemented with a super-heterodyne or direct-conversion architecture. In the super-heterodyne architecture, a signal is frequency-converted between RF and baseband in multiple stages, e.g., from RF to an intermediate frequency (IF) in one stage and then from IF to baseband in another stage. In the direct-conversion architecture, a signal is frequency-converted between RF and baseband in one stage. The super-heterodyne and direct-conversion architectures may use different circuit blocks and/or have different requirements. In the wireless communications device 500 in FIG. 5, the transmitter 508 and the receiver 510 are implemented with the direct-conversion architecture.

In the transmit path, the data processor 506 processes data to be transmitted and provides I and Q analog output signals to the transmitter 508. In the exemplary wireless communications device 500, the data processor 506 includes digital-to-analog converters (DACs) 512(1), 512(2) for converting digital signals generated by the data processor 506 into I and Q analog output signals, e.g., I and Q output currents, for further processing.

Within the transmitter 508, lowpass filters 514(1), 514(2) filter the I and Q analog output signals, respectively, to remove undesired signals caused by the prior digital-to-analog conversion. Amplifiers (AMPs) 516(1), 516(2) amplify the signals from the lowpass filters 514(1), 514(2), respectively, and provide I and Q baseband signals. An upconverter 518 upconverts the I and Q baseband signals with I and Q transmit (TX) local oscillator (LO) signals from a TX LO signal generator 522 through mixers 520(1), 520(2) to provide an upconverted signal 524. A filter 526 filters the upconverted signal 524 to remove undesired signals caused by the frequency upconversion and noise in a receive frequency band. A power amplifier (PA) 528 amplifies the upconverted signal 524 from the filter 526 to obtain the desired output power level and provides a transmit RF signal. The transmit RF signal is routed through a duplexer or switch 530 and transmitted via an antenna 532.

In the receive path, the antenna 532 receives signals transmitted by base stations and provides a received RF signal, which is routed through the duplexer or switch 530 and provided to a low noise amplifier (LNA) 534. The duplexer or switch 530 is designed to operate with a specific receive (RX)-to-TX duplexer frequency separation, such that RX signals are isolated from TX signals. The received RF signal is amplified by the LNA 534 and filtered by a filter 536 to obtain a desired RF input signal. Downconversion mixers 538(1), 538(2) mix the output of the filter 536 with I and Q RX LO signals (i.e., LO_I and LO_Q) from an RX LO signal generator 540 to generate I and Q baseband signals. The I and Q baseband signals are amplified by AMPs 542(1), 542(2) and further filtered by lowpass filters 544(1), 544(2) to obtain I and Q analog input signals, which are provided to the data processor 506. In this example, the data processor 506 includes analog-to-digital converters (ADCs) 546(1), 546(2) for converting the analog input signals into digital signals to be further processed by the data processor 506.

In the wireless communications device 500 of FIG. 5, the TX LO signal generator 522 generates the I and Q TX LO signals used for frequency upconversion, while the RX LO signal generator 540 generates the I and Q RX LO signals used for frequency downconversion. Each LO signal is a periodic signal with a particular fundamental frequency. A TX phase-locked loop (PLL) circuit 548 receives timing information from the data processor 506 and generates a control signal used to adjust the frequency and/or phase of the TX LO signals from the TX LO signal generator 522. Similarly, an RX PLL circuit 550 receives timing information from the data processor 506 and generates a control signal used to adjust the frequency and/or phase of the RX LO signals from the RX LO signal generator 540.

Figure 6:
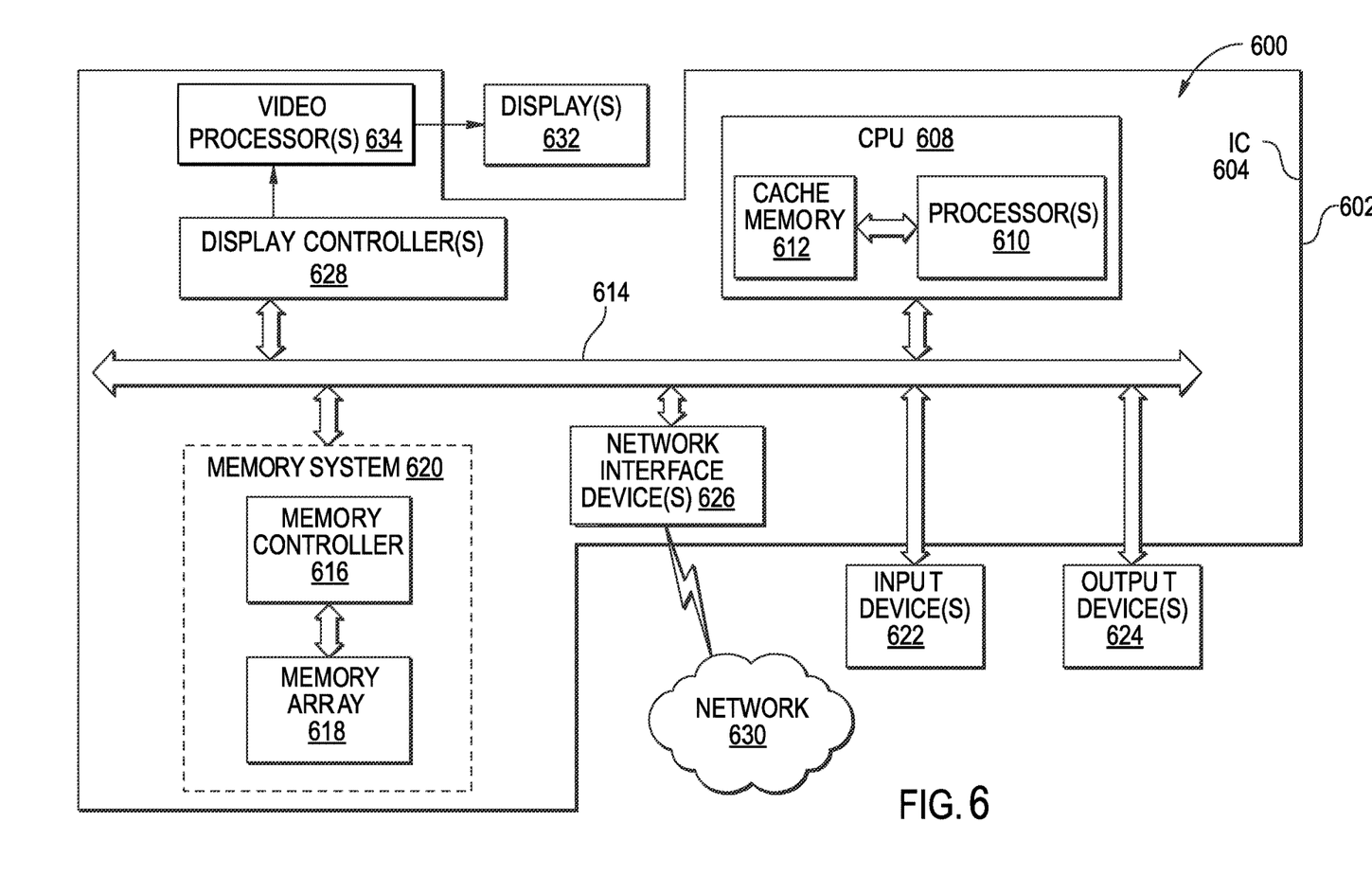
FIG. 6 is a block diagram of an exemplary wireless communication device that includes radio-frequency (RF) components in integrated circuits in which a clock domain includes a plurality of processor cores that each include processing circuits which may include respective margin management circuits as illustrated in FIG. 1 to detect timing margins in critical signal paths and generate signals to adjust a frequency of a clock signal and a voltage controller that adjusts a supply voltage to restore the frequency of the clock signal to a desired frequency as illustrated in the flowchart in FIG. 4.

FIG. 6 illustrates a block diagram of an example of a processor-based system 600 that may be implemented on the IC 100 in FIG. 1 in which a clock domain includes processing circuits that may include respective margin management circuits as shown in FIG. 2 employed to detect timing margins in critical signal paths and generate signals to adjust a frequency of a clock signal and a voltage controller as shown in FIG. 1 that adjusts a supply voltage to restore the frequency of the clock signal to a desired frequency. In this example, the processor-based system 600 includes a processor 602 that includes an IC 604 including one or more central processor units (CPUs) 608, which may also be referred to as CPU or processor cores, each including one or more processors 610. The CPU(s) 608 may have cache memory 612 coupled to the processor(s) 602 for rapid access to temporarily stored data. The CPU(s) 608 is coupled to a system bus 614 and can intercouple master and slave devices included in the processor-based system 600. As is well known, the CPU(s) 608 communicates with these other devices by exchanging address, control, and data information over the system bus 614. For example, the CPU(s) 608 can communicate bus transaction requests to a memory controller 616 as an example of a slave device. Although not illustrated in FIG. 6, multiple system buses 614 could be provided wherein each system bus 614 constitutes a different fabric.

Other master and slave devices can be connected to the system bus 614. As illustrated in FIG. 6, these devices can include a memory system 620 that includes the memory controller 616 and one or more memory arrays 618, one or more input devices 622, one or more output devices 624, one or more network interface devices 626, and one or more display controllers 628, as examples. The input device(s)

622 can include any type of input device, including, but not limited to, input keys, switches, voice processors, etc. The output device(s) 624 can include any type of output device, including, but not limited to, audio, video, other visual indicators, etc. The network interface device(s) 626 can be any device configured to allow an exchange of data to and from a network 630. The network 630 can be any type of network, including, but not limited to, a wired or wireless network, a private or public network, a local area network (LAN), a wireless local area network (WLAN), a wide area network (WAN), a BLUETOOTH™ network, and the Internet. The network interface device(s) 626 can be configured to support any type of communications protocol desired.

The CPU(s) 608 may also be configured to access the display controller(s) 628 over the system bus 614 to control information sent to one or more displays 632. The display controller(s) 628 sends information to the display(s) 632 to be displayed via one or more video processors 634, which process the information to be displayed into a format suitable for the display(s) 632. The display(s) 632 can include any type of display, including, but not limited to, a cathode ray tube (CRT), a liquid crystal display (LCD), a plasma display, or a light-emitting diode (LED) display, etc.

Those of skill in the art will further appreciate that the various illustrative logical blocks, modules, circuits, and algorithms described in connection with the aspects disclosed herein may be implemented as electronic hardware, instructions stored in memory or in another computer-readable medium wherein any such instructions are executed by a processor or other processing device, or combinations of both. As examples, the devices and components described herein may be employed in any circuit, hardware component, integrated circuit (IC), or IC chip. Memory disclosed herein may be any type and size of memory and may be configured to store any desired information. To clearly illustrate this interchangeability, various illustrative components, blocks, modules, circuits, and steps have been described above generally in terms of their functionality. How such functionality is implemented depends upon the particular application, design choices, and/or design constraints imposed on the overall system. Skilled artisans may implement the described functionality in varying ways for each particular application, but such implementation decisions should not be interpreted as causing a departure from the scope of the present disclosure.

The various illustrative logical blocks, modules, and circuits described in connection with the aspects disclosed herein may be implemented or performed with a processor, a Digital Signal Processor (DSP), an Application Specific Integrated Circuit (ASIC), a Field Programmable Gate Array (FPGA) or other programmable logic device, discrete gate or transistor logic, discrete hardware components, or any combination thereof designed to perform the functions described herein. A processor may be a microprocessor, but in the alternative, the processor may be any conventional processor, controller, microcontroller, or state machine. A processor may also be implemented as a combination of computing devices (e.g., a combination of a DSP and a microprocessor, a plurality of microprocessors, one or more microprocessors in conjunction with a DSP core, or any other such configuration).

The aspects disclosed herein may be embodied in hardware and in instructions that are stored in hardware and may reside, for example, in Random Access Memory (RAM), flash memory, Read-Only Memory (ROM), Electrically Programmable ROM (EPROM), Electrically Erasable Programmable ROM (EEPROM), registers, a hard disk, a removable disk, a CD-ROM, or any other form of computer-readable medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a remote station. Alternatively, the processor and the storage medium may reside as discrete components in a remote station, base station, or server.

It is also noted that the operational steps described in any of the exemplary aspects herein are described to provide examples and discussion. The operations described may be performed in numerous different sequences other than the illustrated sequences. Furthermore, operations described in a single operational step may actually be performed in a number of different steps. Additionally, one or more operational steps discussed in the exemplary aspects may be combined. It is to be understood that the operational steps illustrated in the flowchart diagrams may be subject to numerous different modifications, as will be readily apparent to one of skill in the art. Those of skill in the art will also understand that information and signals may be represented using various technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples and designs described herein but is to be accorded the widest scope consistent with the principles and novel features disclosed herein.

Implementation examples are described in the following numbered clauses:

1. An integrated circuit (IC), comprising a first clock domain comprising:
    a first processing circuit comprising:
        a first critical signal path having a first propagation delay based on a supply voltage provided to the first clock domain, wherein the first critical signal path is one of a plurality of critical signal paths that limit a frequency of a clock signal provided to the first clock domain; and
    a margin management circuit comprising:
        a configurable logic circuit comprising a first delay path having a first configurable delay corresponding to the first propagation delay;
        an edge detector circuit configured to detect a first timing margin of the first delay path, the first timing margin based on a time difference between the first configurable delay and a period of the clock signal; and
        a frequency adjustment circuit configured to generate a first frequency adjustment signal to adjust the frequency of the clock signal based on the first timing margin.
2. The IC of clause 1, wherein the first critical signal path is coupled to a data input of a sequential logic circuit configured to update a voltage state of a data storage node in response to the clock signal and a signal received on the data input.

3. The IC of clause 1 or clause 2, wherein the edge detector circuit is further configured to indicate the first timing margin as one of a plurality of incremental magnitudes having a polarity sign.

4. The IC of any of clause 1 to clause 3, wherein the first delay path of the configurable logic circuit comprises a not-AND (NAND) logic circuit and/or a not-OR (NOR) logic circuit.

5. The IC of any of clause 1 to clause 3, wherein the first delay path of the configurable logic circuit comprises an adder circuit.

6. The IC of any of clause 1 to clause 5, wherein the frequency adjustment circuit is further configured to employ a look-up table to determine the first frequency adjustment signal corresponding to the first timing margin.

7. The IC of any of clause 1 to clause 6, wherein the frequency adjustment circuit is further configured to generate the first frequency adjustment signal to control the frequency of the clock signal based on the time difference between the first configurable delay of the first delay path and the period of the clock signal.

8. The IC of any of clause 1 to clause 7, wherein:
the configurable logic circuit comprises a second delay path configured to have a second configurable delay corresponding to a second propagation delay of a second critical signal path of the plurality of critical signal paths of the first processing circuit; and
a second edge detector circuit is configured to detect a second timing margin of the second delay path;
wherein the frequency adjustment circuit is further configured to generate the first frequency adjustment signal based on a greater of the first timing margin and the second timing margin.

9. The IC of clause 8, the margin management circuit, further comprising a comparator to determine which of the first timing margin and the second timing margin is greater in magnitude.

10. The IC of any of clause 1 to clause 7, further comprising:
a second processing circuit comprising a second plurality of critical signal paths that limit the frequency of the clock signal; and
a second margin management circuit comprising:
a second configurable logic circuit comprising a second delay path configured to have a second configurable delay corresponding to a second propagation delay of a second critical signal path of the second plurality of critical signal paths;
a second edge detector circuit configured to detect a second timing margin of the second delay path; and
a second frequency adjustment circuit configured to generate a second frequency adjustment signal to control the frequency of the clock signal based on the second timing margin.

11. The IC of clause 10, the first clock domain further comprising:
a plurality of processors comprising a first processor comprising the first processing circuit and the second processing circuit, wherein:
each of the plurality of processors comprises a plurality of processing circuits each configured to generate one of a plurality of frequency adjustment signals; and
the first frequency adjustment signal and the second frequency adjustment signal are among the plurality of frequency adjustment signals generated in the first processor;
an adjustment signal accumulator configured to:
identify a top adjustment signal comprising one of the plurality of frequency adjustment signals having a greatest magnitude; and
generate a frequency control signal based on the top adjustment signal; and
a clock control circuit configured to:
receive the frequency control signal; and
control the frequency of the clock signal provided to the first clock domain based on the frequency control signal received in a plurality of cycles of the clock signal.

12. The IC of any of clause 1 to clause 11, further comprising a voltage controller configured to:
receive a first indication of the frequency of the clock signal;
receive a second indication of a desired frequency of the clock signal; and
generate a voltage control signal to adjust the supply voltage provided to the first clock domain based on a difference between the first indication and the second indication.

13. The IC of clause 12, wherein the voltage controller is further configured to:
in response to the frequency of the clock signal being higher than the desired frequency of the clock signal by at least a first threshold, generate the voltage control signal to decrease the supply voltage provided to the first clock domain; and
in response to the frequency of the clock signal being lower than the desired frequency of the clock signal by at least a second threshold, generate the voltage control signal to increase the supply voltage provided to the first clock domain.

14. The IC of clause 13, wherein the voltage controller is configured to:
in response to the difference between the frequency of the clock signal and the desired frequency of the clock signal being smaller than the first threshold and the second threshold, generate the voltage control signal to maintain the supply voltage provided to the first clock domain.

15. The IC of any of clause 12 to clause 14, wherein the voltage controller is configured to:
compare the frequency of the clock signal to the desired frequency of the clock signal in each cycle of the clock signal;
update the voltage control signal no more often than once in every first period, where the first period comprises a plurality of cycles of the clock signal; and
update the voltage control signal to change the supply voltage by no more than a first voltage increment in each first period.

16. The IC of any of clause 1 to clause 15 integrated into a device selected from the group consisting of: a set-top box; an entertainment unit; a navigation device; a communications device; a fixed location data unit; a mobile location data unit; a global positioning system (GPS) device; a mobile phone; a cellular phone; a smartphone; a session initiation protocol (SIP) phone; a tablet; a phablet; a server; a computer; a portable computer; a mobile computing device; a wearable computing device; a desktop computer; a personal digital assistant (PDA); a monitor; a computer monitor; a television; a tuner; a radio; a satellite radio; a music player; a digital music player; a portable music player; a digital video player; a video player; a digital video disc (DVD) player; a portable digital video player; an automobile; a vehicle component; an avionics system; a drone; and a multicopter.

17. A method in an integrated circuit (IC), the method comprising:
   configuring a first delay path of a configurable logic circuit to have a first configurable delay corresponding to a first propagation delay of a first critical signal path of a plurality of critical signal paths in a first processing circuit in a first clock domain, wherein:
      the first propagation delay is based on a supply voltage provided to the first clock domain; and
      each of the plurality of critical signal paths limit a frequency of a clock signal provided to the first clock domain;
   detecting a first timing margin of the first delay path, the first timing margin based on a time difference between the first configurable delay and a period of the clock signal; and
   generating a first frequency adjustment signal to control the frequency of the clock signal based on the first timing margin.

18. The method of clause 17, further comprising indicating the first timing margin as one of a plurality of incremental magnitudes having a polarity sign.

19. The method of clause 17 or clause 18, further comprising employing a look-up table to determine the first frequency adjustment signal corresponding to the first timing margin.

20. The method of any of clause 17 to clause 19, further comprising generating the first frequency adjustment signal to control the frequency of the clock signal based on a difference between the first propagation delay of the first critical signal path and the first configurable delay of the first delay path.

21. The method of any of clause 17 to clause 20, further comprising:
   configuring a second delay path of a second configurable logic circuit to have a second configurable delay corresponding to a second propagation delay of a second critical signal path of the plurality of critical signal paths of the first processing circuit;
   detecting, by a second edge detector circuit, a second timing margin of the second delay path; and
   generating the first frequency adjustment signal based on a greater of the first timing margin and the second timing margin.

22. The method of clause 21, further comprising determining, by a comparator, the greater of the first timing margin and the second timing margin.

23. The method of any of clause 17 to clause 19, further comprising:
   configuring a second configurable logic circuit to have a second delay path having a second configurable delay corresponding to a second propagation delay of a second critical signal path of a second plurality of critical signal paths in a second processing circuit;
   detecting a second timing margin of the second delay path; and
   generating a second frequency adjustment signal to control the frequency of the clock signal based on the second timing margin.

24. The method of clause 23, further comprising:
   generating a plurality of frequency adjustment signals in each of a plurality of processors comprising a first processor, wherein the first frequency adjustment signal and the second frequency adjustment signal are among the plurality of frequency adjustment signals generated in the first processor;
   identifying a highest adjustment signal comprising one of the plurality of frequency adjustment signals having a greatest magnitude;
   generating a frequency change signal based on the highest adjustment signal;
   receiving the frequency change signal; and
   controlling the frequency of the clock signal provided to the first clock domain based on the frequency change signal received in a first plurality of cycles of the clock signal.

25. The method of clause 24, further comprising:
   receiving a first frequency indication of the frequency of the clock signal provided to the first clock domain;
   receiving a second frequency indication of a desired frequency of the clock signal; and
   generating a voltage control signal to adjust the supply voltage provided to the first clock domain based on a difference between the first frequency indication and the second frequency indication.

26. The method of clause 25, further comprising
   comparing the frequency of the clock signal to the desired frequency of the clock signal in each cycle of the clock signal;
   updating the voltage control signal no more often than once in every first period, where the first period comprises a second plurality of cycles of the clock signal; and
   updating the voltage control signal to change the supply voltage by no more than a first voltage increment in each first period.

27. A package comprising an integrated circuit (IC), comprising:
   a first clock domain comprising a plurality of processors configured to operate at a frequency of a clock signal, each of the plurality of processors comprising:
      a first processing circuit comprising a first critical signal path having a first propagation delay based on a supply voltage provided to the first clock domain, wherein the first critical signal path is one of a plurality of critical signal paths that limit a maximum frequency of the clock signal; and
      a margin management circuit comprising:
         a configurable logic circuit comprising a first delay path configured to have a first configurable delay corresponding to the first propagation delay;
         an edge detector circuit configured to detect a first timing margin of the first delay path; and
         a frequency adjustment circuit configured to generate a first frequency adjustment signal to control the frequency of the clock signal based on the first timing margin;

wherein:
each of the plurality of processors is configured to generate a plurality of frequency adjustment signals; and
the first frequency adjustment signal and a second frequency adjustment signal are among the plurality of frequency adjustment signals generated in a first processor;
an adjustment signal accumulator configured to:
identify a highest adjustment signal comprising one of the plurality of frequency adjustment signals having a greatest magnitude; and
generate a frequency change signal based on the highest adjustment signal;
a timing margin control circuit configured to:
receive the frequency change signal; and
generate a clock frequency control signal based on the frequency change signal received in a plurality of cycles of the clock signal;
a clock generation circuit configured to generate the clock signal having the frequency based on the clock frequency control signal;
a voltage controller configured to:
receive a first indication of the frequency of the clock signal;
receive a second indication of a desired frequency of the clock signal; and
generate a voltage control signal to adjust the supply voltage provided to the first clock domain based on a difference between the first indication and the second indication; and
a voltage regulator configured to provide the supply voltage to the first clock domain based on the voltage control signal.

What is claimed is:

1. An integrated circuit (IC), comprising a first clock domain comprising:
a first processing circuit comprising:
a first critical signal path having a first propagation delay based on a supply voltage provided to the first clock domain, wherein the first critical signal path is one of a plurality of critical signal paths that limit a frequency of a clock signal provided to the first clock domain; and
a margin management circuit comprising:
a configurable logic circuit comprising a first delay path having a first configurable delay corresponding to the first propagation delay;
an edge detector circuit configured to detect a first timing margin of the first delay path, the first timing margin based on a time difference between the first configurable delay and a period of the clock signal; and
a frequency adjustment circuit configured to generate a first frequency adjustment signal to adjust the frequency of the clock signal based on the first timing margin.

2. The IC of claim 1, wherein the first critical signal path is coupled to a data input of a sequential logic circuit configured to update a voltage state of a data storage node in response to the clock signal and a signal received on the data input.

3. The IC of claim 1, wherein the edge detector circuit is further configured to indicate the first timing margin as one of a plurality of incremental magnitudes having a polarity sign.

4. The IC of claim 1, wherein the first delay path of the configurable logic circuit comprises a not-AND (NAND) logic circuit and/or a not-OR (NOR) logic circuit.

5. The IC of claim 1, wherein the first delay path of the configurable logic circuit comprises an adder circuit.

6. The IC of claim 1, wherein the frequency adjustment circuit is further configured to employ a look-up table to determine the first frequency adjustment signal corresponding to the first timing margin.

7. The IC of claim 1, wherein the frequency adjustment circuit is further configured to generate the first frequency adjustment signal to control the frequency of the clock signal based on the time difference between the first configurable delay of the first delay path and the period of the clock signal.

8. The IC of claim 1, wherein:
the configurable logic circuit comprises a second delay path configured to have a second configurable delay corresponding to a second propagation delay of a second critical signal path of the plurality of critical signal paths of the first processing circuit; and
a second edge detector circuit is configured to detect a second timing margin of the second delay path;
wherein the frequency adjustment circuit is further configured to generate the first frequency adjustment signal based on a greater of the first timing margin and the second timing margin.

9. The IC of claim 8, the margin management circuit further comprising a comparator to determine which of the first timing margin and the second timing margin is greater in magnitude.

10. The IC of claim 1, further comprising:
a second processing circuit comprising a second plurality of critical signal paths that limit the frequency of the clock signal; and
a second margin management circuit comprising:
a second configurable logic circuit comprising a second delay path configured to have a second configurable delay corresponding to a second propagation delay of a second critical signal path of the second plurality of critical signal paths;
a second edge detector circuit configured to detect a second timing margin of the second delay path; and
a second frequency adjustment circuit configured to generate a second frequency adjustment signal to control the frequency of the clock signal based on the second timing margin.

11. The IC of claim 10, the first clock domain further comprising:
a plurality of processors comprising a first processor comprising the first processing circuit and the second processing circuit, wherein:
each of the plurality of processors comprises a plurality of processing circuits, each configured to generate one of a plurality of frequency adjustment signals; and
the first frequency adjustment signal and the second frequency adjustment signal are among the plurality of frequency adjustment signals generated in the first processor;
an adjustment signal accumulator configured to:
identify a top adjustment signal comprising one of the plurality of frequency adjustment signals having a greatest magnitude; and
generate a frequency control signal based on the top adjustment signal; and a clock control circuit configured to:
receive the frequency control signal; and
control the frequency of the clock signal provided to the first clock domain based on the frequency control signal received in a plurality of cycles of the clock signal.

12. The IC of claim 1, further comprising a voltage controller configured to:
receive a first indication of the frequency of the clock signal;
receive a second indication of a desired frequency of the clock signal; and
generate a voltage control signal to adjust the supply voltage provided to the first clock domain based on a difference between the first indication and the second indication.

13. The IC of claim 12, wherein the voltage controller is further configured to:
in response to the frequency of the clock signal being higher than the desired frequency of the clock signal by at least a first threshold, generate the voltage control signal to decrease the supply voltage provided to the first clock domain; and
in response to the frequency of the clock signal being lower than the desired frequency of the clock signal by at least a second threshold, generate the voltage control signal to increase the supply voltage provided to the first clock domain.

14. The IC of claim 13, wherein the voltage controller is configured to:
in response to the difference between the frequency of the clock signal and the desired frequency of the clock signal being smaller than the first threshold and the second threshold, generate the voltage control signal to maintain the supply voltage provided to the first clock domain.

15. The IC of claim 12, wherein the voltage controller is configured to:
compare the frequency of the clock signal to the desired frequency of the clock signal in each cycle of the clock signal;
update the voltage control signal no more often than once in every first period, where the first period comprises a plurality of cycles of the clock signal; and
update the voltage control signal to change the supply voltage by no more than a first voltage increment in each first period.

16. The IC of claim 1 integrated into a device selected from the group consisting of: a set-top box; an entertainment unit; a navigation device; a communications device; a fixed location data unit; a mobile location data unit; a global positioning system (GPS) device; a mobile phone; a cellular phone; a smartphone; a session initiation protocol (SIP) phone; a tablet; a phablet; a server; a computer; a portable computer; a mobile computing device; a wearable computing device; a desktop computer; a personal digital assistant (PDA); a monitor; a computer monitor; a television; a tuner; a radio; a satellite radio; a music player; a digital music player; a portable music player; a digital video player; a video player; a digital video disc (DVD) player; a portable digital video player; an automobile; a vehicle component; an avionics system; a drone; and a multicopter.

17. A method in an integrated circuit (IC), the method comprising:
configuring a first delay path of a configurable logic circuit to have a first configurable delay corresponding to a first propagation delay of a first critical signal path of a plurality of critical signal paths in a first processing circuit in a first clock domain, wherein:
the first propagation delay is based on a supply voltage provided to the first clock domain; and
each of the plurality of critical signal paths limit a frequency of a clock signal provided to the first clock domain;
detecting a first timing margin of the first delay path, the first timing margin based on a time difference between the first configurable delay and a period of the clock signal; and
generating a first frequency adjustment signal to control the frequency of the clock signal based on the first timing margin.

18. The method of claim 17, further comprising indicating the first timing margin as one of a plurality of incremental magnitudes having a polarity sign.

19. The method of claim 17, further comprising employing a look-up table to determine the first frequency adjustment signal corresponding to the first timing margin.

20. The method of claim 17, further comprising generating the first frequency adjustment signal to control the frequency of the clock signal based on a difference between the first propagation delay of the first critical signal path and the first configurable delay of the first delay path.

21. The method of claim 17, further comprising:
configuring a second delay path of a second configurable logic circuit to have a second configurable delay corresponding to a second propagation delay of a second critical signal path of the plurality of critical signal paths of the first processing circuit;
detecting, by a second edge detector circuit, a second timing margin of the second delay path; and
generating the first frequency adjustment signal based on a greater of the first timing margin and the second timing margin.

22. The method of claim 21, further comprising determining, by a comparator, the greater of the first timing margin and the second timing margin.

23. The method of claim 17, further comprising:
configuring a second configurable logic circuit to have a second delay path having a second configurable delay corresponding to a second propagation delay of a second critical signal path of a second plurality of critical signal paths in a second processing circuit;
detecting a second timing margin of the second delay path; and
generating a second frequency adjustment signal to control the frequency of the clock signal based on the second timing margin.

24. The method of claim 23, further comprising:
generating a plurality of frequency adjustment signals in each of a plurality of processors comprising a first processor, wherein the first frequency adjustment signal and the second frequency adjustment signal are among the plurality of frequency adjustment signals generated in the first processor;
identifying a highest adjustment signal comprising one of the plurality of frequency adjustment signals having a greatest magnitude;
generating a frequency change signal based on the highest adjustment signal;
receiving the frequency change signal; and
controlling the frequency of the clock signal provided to the first clock domain based on the frequency change signal received in a first plurality of cycles of the clock signal.

25. The method of claim 24, further comprising:
receiving a first frequency indication of the frequency of the clock signal provided to the first clock domain;
receiving a second frequency indication of a desired frequency of the clock signal; and
generating a voltage control signal to adjust the supply voltage provided to the first clock domain based on a difference between the first frequency indication and the second frequency indication.

26. The method of claim 25, further comprising
comparing the frequency of the clock signal to the desired frequency of the clock signal in each cycle of the clock signal;
updating the voltage control signal no more often than once in every first period, where the first period comprises a second plurality of cycles of the clock signal; and
updating the voltage control signal to change the supply voltage by no more than a first voltage increment in each first period.

27. A package comprising an integrated circuit (IC), comprising:
a first clock domain comprising a plurality of processors configured to operate at a frequency of a clock signal, each of the plurality of processors comprising:
a first processing circuit comprising a first critical signal path having a first propagation delay based on a supply voltage provided to the first clock domain, wherein the first critical signal path is one of a plurality of critical signal paths that limit a maximum frequency of the clock signal; and
a margin management circuit comprising:
a configurable logic circuit comprising a first delay path configured to have a first configurable delay corresponding to the first propagation delay;
an edge detector circuit configured to detect a first timing margin of the first delay path; and
a frequency adjustment circuit configured to generate a first frequency adjustment signal to control the frequency of the clock signal based on the first timing margin;
wherein:
each of the plurality of processors is configured to generate a plurality of frequency adjustment signals; and
the first frequency adjustment signal and a second frequency adjustment signal are among the plurality of frequency adjustment signals generated in a first processor;
an adjustment signal accumulator configured to:
identify a highest adjustment signal comprising one of the plurality of frequency adjustment signals having a greatest magnitude; and
generate a frequency change signal based on the highest adjustment signal;
a timing margin control circuit configured to:
receive the frequency change signal; and
generate a clock frequency control signal based on the frequency change signal received in a plurality of cycles of the clock signal;
a clock generation circuit configured to generate the clock signal having the frequency based on the clock frequency control signal;
a voltage controller configured to:
receive a first indication of the frequency of the clock signal;
receive a second indication of a desired frequency of the clock signal; and
generate a voltage control signal to adjust the supply voltage provided to the first clock domain based on a difference between the first indication and the second indication; and
a voltage regulator configured to provide the supply voltage to the first clock domain based on the voltage control signal.

* * * * *